United States Patent [19]

Cheung

[11] Patent Number: 5,604,711
[45] Date of Patent: Feb. 18, 1997

[54] LOW POWER HIGH VOLTAGE SWITCH WITH GATE BIAS CIRCUIT TO MINIMIZE POWER CONSUMPTION

[75] Inventor: Sammy S. Y. Cheung, Pleasanton, Calif.

[73] Assignee: Cypress Semiconductor, Corporation, San Jose, Calif.

[21] Appl. No.: 446,539

[22] Filed: May 19, 1995

[51] Int. Cl.$^6$ .................... G11C 7/00; G11C 8/00
[52] U.S. Cl. ................ 365/230.06; 365/185.23; 365/227; 365/242
[58] Field of Search .................. 365/185.23, 189.09, 365/226, 230.06, 242, 185.26, 185.33, 227

[56] References Cited

U.S. PATENT DOCUMENTS

| | | | |
|---|---|---|---|
| 5,341,329 | 8/1994 | Takebuchi | 365/185 |
| 5,365,479 | 11/1994 | Hoang et al. | 365/185 |
| 5,392,253 | 2/1995 | Atsumi et al. | 365/185 |
| 5,414,669 | 5/1995 | Tedrow et al. | 365/226 |

*Primary Examiner*—David C. Nelms
*Assistant Examiner*—Trong Phan
*Attorney, Agent, or Firm*—Blakely, Sokoloff, Taylor & Zafman

[57] ABSTRACT

A memory circuit with a low power programming voltage switch for reduced leakage current during a read operation. The apparatus includes a high voltage switch which, in a programming mode receives a high (e.g. programming) voltage and in another mode (reading) receives a normal range voltage, and a line driver which drivers a selection or non-selection voltage into word lines or column select lines into a memory array. During a read mode, the deselected line drivers and high voltage switches are operated in a reduced leakage current mode such that leakage current is forced through selected line drivers and their high voltage switches before being forced through the deselected line drivers such that the leakage current is limited to the number of selected line drivers.

31 Claims, 7 Drawing Sheets

$$I = \sum I_i$$

LOW POWER HIGH VOLTAGE SWITCH WITH GATE BIAS CIRCUIT TO MINIMIZE POWER CONSUMPTION

FIELD OF THE INVENTION

The present invention relates to the field of memories, particularly in integrated circuit form. More specifically, this invention relates to circuitry in a programmable memory device for a high voltage switching scheme.

BACKGROUND OF THE INVENTION

One type of prior nonvolatile integrated circuit memory is the erasable programmable read-only memory ("EPROM"). EPROMs frequently use memory cells that have electrically isolated gates (floating gates) such as an enhancement-type n-channel metal-oxide semiconductor field effect transistor (MOSFET) with two gates made of polysilicon material. One of the gates in this enhancement-type-n-channel MOSFET is not electrically connected to any other part of the circuit (e.g. a floating gate) and the other gate in this enhancement-type n-channel MOSFET functions in the same manner as the gate of a regular enhancement MOSFET (Adel S. Sedra and Kenneth C. Smith, "Microelectronics Circuits", CBS College Publishing, 1982, pp. 776–780). The EPROM stores information in the memory cells in the form of charge on the floating gates and is programmed by placing a charge on the floating gates. The EPROM can be programmed by a user, and once programmed, the EPROM retains its data until erased. Other memory devices such as a Flash Electrically Erasable Programmable Read Only Memory ("EEPROM") are also user programmable. Flash EEPROMs are also programmed by electrically injecting a charge onto the floating gates.

The EPROM comprises memory cells logically organized by rows and columns which form a memory array. Typically, the rows represent word lines and the columns represent bit lines. Furthermore, the EPROM has a column decoder for decoding the appropriate bit lines and a row decoder for decoding the appropriate word lines of each individual memory cell selected to be either programmed or read.

Typically, during programming, the user provides the appropriate voltage signals at the input/output pins of the device to select the rows and columns of the memory cells selected to be programmed. Furthermore, the user applies a high voltage signal (approximately 13 volts) at the programming input Vpp which generates a programming current that flows through each selected bit line to increase the drain voltage of each selected memory cell, thereby accelerating electrons through the channel of the selected memory cell.

Simultaneously, the programming voltage generates another programming current that passes through each selected word line to increase the voltage at the control gate of each selected memory cell, thereby establishing an electric field in the insulating oxide of the selected memory cell. This electric field attracts the hot electrons and accelerates them toward the floating gate. In this way, the floating gate is charged, and the charge that accumulates on it becomes trapped, thus programming each selected memory cell.

During a reading operation, the user also provides the appropriate voltage signals at the input/output pins of the device to select the rows and columns of the desired memory cells in which data is to be read from. Thus, during a reading operation, a voltage (in some embodiments approximately Vcc) is applied to the word line of each selected row. The memory cells that are not programmed will conduct heavily, thus lowering the voltage of its bit line. On the other hand, a programmed cell will not conduct and its bit line remains at a high voltage (if the bit lines are precharged to high voltages). The column decoder selects at least one of the bit lines and connects it a sense amplifier which, in turn, detects the change in voltage of the bit line and thus determines whether the stored bit is a "1" or a "0". Typically, a programmed memory cell stores a "1" and an unprogrammed memory cell stores a "0".

Thus, in order to effectively program or read a memory cell, the appropriate voltage level must be applied over the word line and bit line to the selected memory cell. Typically, about 13 volts is applied to the gates of the memory cells and about 6.5 v is applied to the drains of the memory cells selected during a programming operation. A voltage of about Vcc is applied to the gates of the memory cells and about 1.5 v is applied to the drain of the memory cells selected during a reading operation. Furthermore, when a memory cell is not selected (e.g. deselected) for either a reading operation or a programming operation, Vss is applied over the bit line or word line.

Therefore, a high voltage switch provides a conductive pathway for the current generated from the programming input Vpp to flow from the programming input Vpp onto the selected lines during a programming operation, thus, increasing the voltage on the selected lines to the voltage level necessary to program the memory cells. During programming, the high voltage switch also isolates the current generated from the programming input Vpp from the deselected lines, thus, preventing the programming current from increasing the voltage on the deselected lines. However, during a reading operation, the high voltage switch is bypassed altogether such that the voltage on the lines is not affected by the voltage provided at the programming input Vpp.

Typically, a programmable memory device performs reading operations much more frequently than the programming operations. For example, a programmable memory device may be programmed once or twice before being placed in a system, and once installed in the system the programmable memory device may perform reading operations continually. Therefore, it is desirable to reduce the DC power consumption of the programmable memory device by reducing the leakage current during a reading operation.

The high voltage switch design in the prior art provides a current leakage path through each high voltage switch coupled to a deselected line. Therefore, as the number of deselected lines increases (which occurs whenever the number of memory cells on an IC increases), the overall leakage current of the programmable memory device increases. In other words, the larger the memory array in the prior art programmable memory device, the more DC power the device consumes. For example, each deselected line in a particular 1 Megabit EPROM device draws approximately 30 micro amps of leakage current from VCC to VSS. Since the number of deselected lines in a high density EPROM (e.g. greater than one Megabit) is greater than 1000 lines, the leakage current through the high voltage switches is at least 32 milli amps.

Therefore, as denser programmable memory devices (having more memory cells on an IC) are designed, it is desirable to reduce the amount of leakage current flowing through the high voltage switches while maintaining the functionality of each high voltage switch. The present invention provides a high voltage switch (HVS) design that performs high voltage-charge up and high voltage isolation during a programming operation while providing the capability of significantly reducing the overall DC power consumption through the HVSs during a reading operation. For example, the leakage current may be reduced from approximately 32 milli amps to approximately 3.25 milli amps in a particular (1 Megabit) EPROM device. Therefore, by providing low power high voltage switches that reduce the total leakage current during a reading operation, the power consumption of the memory circuit is minimized.

SUMMARY OF THE INVENTION

It is desirable to reduce the DC power consumption of a nonvolatile programmable memory by providing low power high voltage switches that maintain their functionality. During a reading operation, the high voltage switches are bypassed such that the voltage applied to the lines (word lines and column select lines) from the decode logic (row decode logic and column decode logic) are applied to the memory array. During a programming operation, the deselected high voltage switches isolate the high voltage from being applied to the memory array over the deselected lines. Also when programming, the selected high voltage switches provide a conductive pathway for the high voltage to be applied to the memory array through the high voltage switches and over each selected line. Furthermore, the selected high voltage switches also provide the required charge-up speed during programming.

Since the programmable memory device operates predominantly in the reading mode, it is desirable that the high voltage switches are designed to minimize the leakage current during a reading operation. By reducing the number of available current leakage paths from a first voltage conduit (Vcc) to a second voltage conduit (Vss) the overall leakage current of the device can be minimized. Rather than having the leakage current flow from Vcc of each deselected high voltage switch over the corresponding deselected line and out through Vss of the corresponding deselected line driver during a reading operation, the present invention provides a current leakage path from Vcc of each selected line driver, through the corresponding selected line and the corresponding selected high voltage switch, over the high voltage line, through each deselected high voltage switch and the corresponding deselected line, and out through Vss of the corresponding deselected line driver during a reading operation.

In other words, by requiring the leakage current to flow from the selected lines and out through the deselected lines in the present invention, the number of current leakage paths from Vcc to Vss is limited by the number of selected lines. If the leakage current is required to flow only through the deselected lines (as in the prior art), then the number of current leakage paths is expanded to include the total the number of deselected lines. Since there are typically many more deselected lines than selected lines during a reading operation, limiting the number of current leakage paths to the number of selected lines significantly reduces the total leakage current and thus the overall DC power consumption.

For example, if a total of 5 lines (including both word lines and column select lines) are selected and a total of 1050 lines are deselected, approximately 650 micro amps of leakage current flows from each selected line and out through the deselected lines. Thus, the total current leakage through the memory circuit is approximately 3.25 milli amps (5 lines×650 micro amps). On the other hand, if the leakage path is solely dependent on the number of the deselected lines, then the number of current paths is significantly increased (from 5 paths in the present invention to 1050 paths in the prior art). Although the current flowing through the prior art current leakage path may be less than 650 micro amps (e.g. 30 micro amps.), the overall current leakage in the prior art may be much greater than about 3.25 milli amps (e.g. 32 milli amps).

It is further desirable to limit the amount of leakage current flowing through the high voltage switches during a reading operation. The addition of a gate bias element to each high voltage switch in the present invention increases the resistivity of the high voltage switch, thus reducing the amount of leakage current flowing through the programmable memory device.

DETAILED DESCRIPTION OF THE PREFERRED EMBODIMENT

One type of memory cell used in EPROMs is the floating gate avalanche injection metal oxide semiconductor (FAMOS) transistor. The FAMOS transistor has a control gate terminal, a floating gate, a source terminal and a drain terminal such that a channel connects the source terminal and the drain terminal. The floating gate is disposed between the channel and a control gate which is coupled to the control gate terminal. The floating gate is electrically isolated from the channel and from the control gate. Isolation is achieved by using a thin insulative layer. Programming is accomplished by creating an avalanche breakdown condition at the drain-to-channel junction. When this happens, electrons are injected through the insulation onto the floating gate. A presently preferred embodiment of an EPROM memory cell utilizes an n-channel FAMOS transistor. The use of FAMOS transistors in memory circuitry is well-known in the art. It will be appreciated that other memory devices, such as Flash EEPROMs (which can be electrically erased) may also be used with the present invention.

The EPROM or nonvolatile memory of the present invention includes a memory array logically organized into columns and rows. According to FIG. 1, FAMOS devices 14, 15, 16 and 17 form memory array 11 with FAMOS devices 14 and 15 forming a first row and FAMOS devices 16 and 17 forming a second row and, furthermore, FAMOS devices 14 and 16 forming a first column and FAMOS devices 15 and 17 forming a second column. The memory array includes word lines 18a and 18b, coupling all FAMOS devices in each row at the gate of each FAMOS device, and bit lines 19a and 19b, coupling all FAMOS devices in each column at the drain of each FAMOS device. Note that the source of FAMOS devices 14, 15, 16 and 17 are coupled to Vss.

Figure 1:
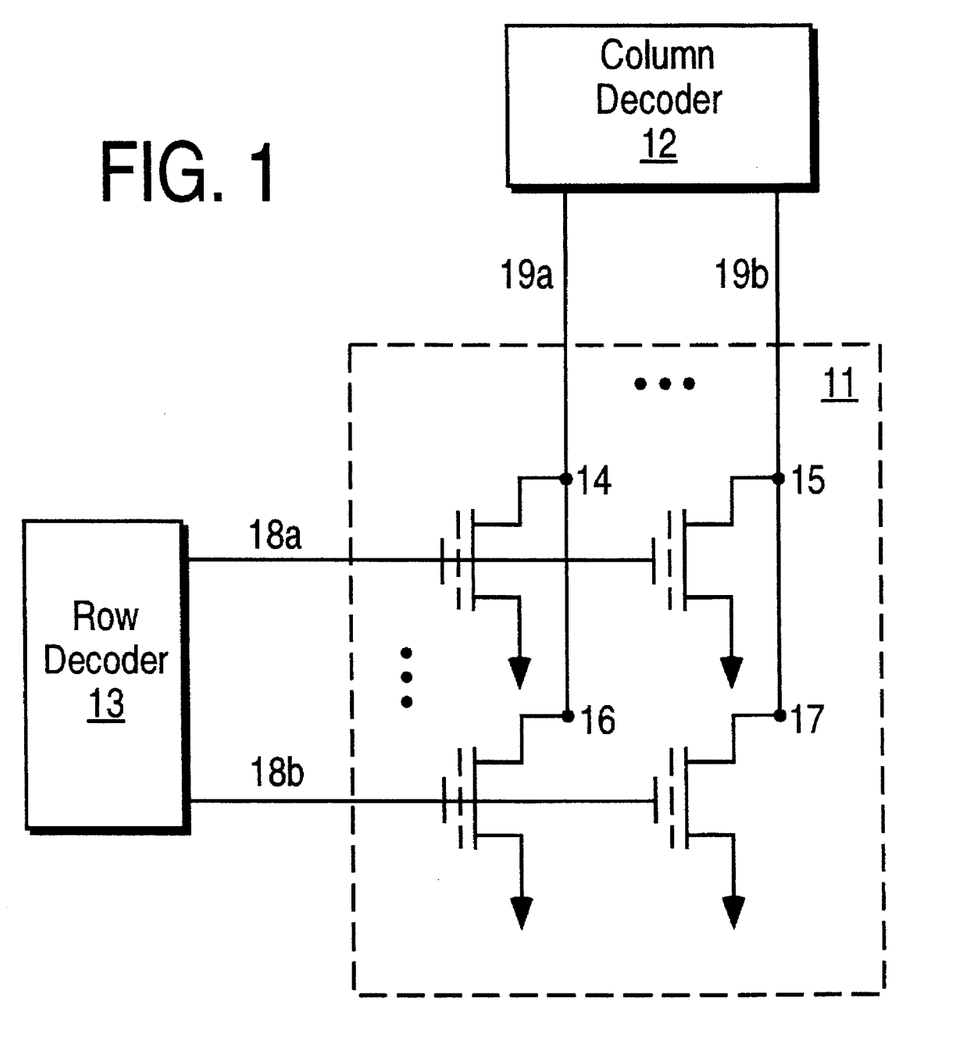
FIG. 1 illustrates a block diagram of an EPROM device.

Furthermore, EPROM 10 includes a column decoder 12 and a row decoder 13 which select the appropriate column and row in memory array 11 according the input address signals provided to column decoder 12 and row decoder 13.

Figure 2:
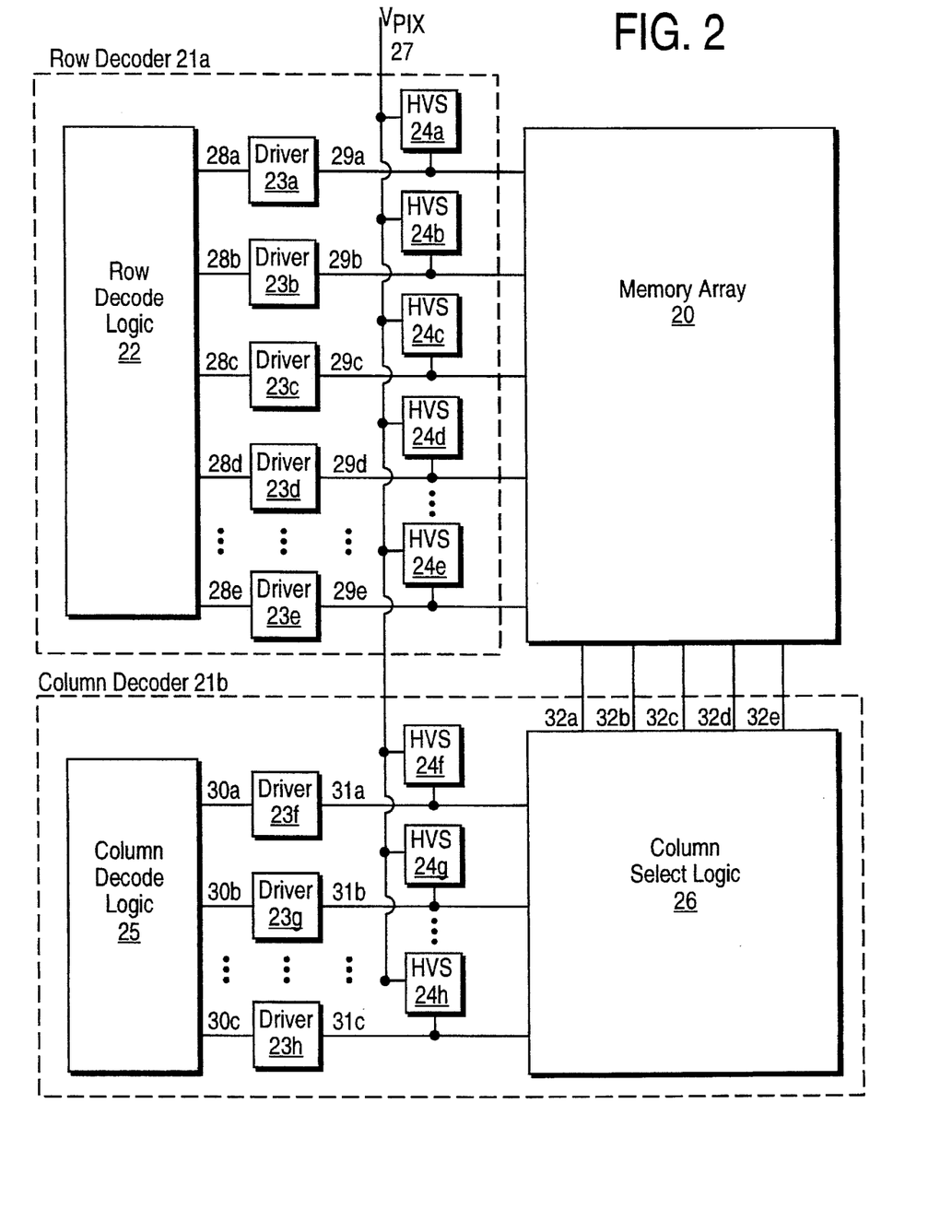
FIG. 2 illustrates a block diagram of the row decoder and column decoder.

According to FIG. 2, row decoder 21a and column decoder 21b each include decode logic to decode the input address signals and to select the appropriate lines, multiple drivers to charge-up the selected lines during a reading operation, and multiple high voltage switches that operate as gates allowing the high voltage on high voltage line 27 to pass to the selected lines and to prevent the high voltage from passing to the deselected (e.g. lines which are not selected by row decoder 22) lines during a programming operation. FIG. 2 also includes high voltage line 27 (voltage Vpix). Voltage Vpix is coupled to programming voltage input Vpp via a conventional voltage pump (not shown). During a programming operation, the high voltage line 27 is set to a high voltage of about 13 volts and during a reading operation, the high voltage line 27 is set to a voltage of about Vss.

Row decoder 21a includes multiple word lines 28a–28e corresponding to the number of rows of memory cells in memory array 20. Each word line 28a–28e has a corresponding word line driver 23a–23e, a corresponding word line 29a–29e and a corresponding high voltage switch 24a–24e. Row decode logic 22 decodes the input address signals and selects at least one word line during a reading operation or programming operation.

During a reading operation each deselected word line (28a–28e) is at Vcc. After passing through deselected word line drivers (23a–23e), the voltage on deselected word lines (29a–29b) is set (e.g. typically by an inverting driver) to approximately Vss. Vss is then applied to each memory cell coupled to a deselected word line (29a–29e). When Vss is applied to the gate of a FAMOS memory cell, data can not be read from the FAMOS memory cell.

On the other hand for a selected word line, during a reading operation, the selected word line (e.g. one of the word lines 28a–28e) is at a voltage of Vss. Typically, there will be one selected word line in a memory array, although one IC may contain several memory arrays and consequently one IC may contain several selected word lines. This voltage is increased by word line drivers (e.g. the corresponding one of the word line drivers 23a–23e) to approximately Vcc which is the voltage applied to each memory cell coupled to a selected word line (e.g. the corresponding one of selected word lines 29a–29e). When Vcc is applied to the gate of a FAMOS device during a reading operation, the FAMOS device can be read provided that the appropriate voltage is being applied to the drain of the FAMOS device. Therefore, during a reading operation, the high voltage switches 24a–24e are bypassed.

During a programming operation, row decode logic 22 applies a voltage of Vss to the selected word line (e.g. one of the word lines 28a–28e) which is applied to the selected word line driver (e.g. the corresponding one of the selected word lines 23a–23e). Here, the selected word line driver operates as a non-conducting pass gate preventing the voltage on the selected word line (e.g. one of 28a–28e) from passing to or from the selected word line (e.g. one of 29a–29e). Since a selected high voltage switch (e.g. one of the HVS 24a–24e) are turned "on", it provides a conductive path for the current generated from the high voltage (approximately 13 volts) on high voltage line 27 to pass to the selected word line (e.g. one of 29a–29e). Thus, the voltage on the selected word line (one of 29a–29e) is increased to the high voltage level. When the high voltage is applied to the gate of the FAMOS memory cells coupled to the selected word line, the selected FAMOS memory cell is programmed, provided that the appropriate programming voltage is applied to drain of the FAMOS memory cell.

On the other hand, during a programming operation, the deselected high voltage switches (usually several of 24a–24e except for the selected HVS) are turned "off." Therefore, the high voltage on high voltage line 27 is isolated from deselected word lines (usually all of the word lines 29a–29 except for the selected word line). Decode logic 22 applies a voltage of Vcc to each deselected word line (e.g. each line 28a–28e except for the seleted word line). The deselected word line drivers reduce the voltage on the deselected word line such that the voltage on the deselected word lines (usually all of lines 29a–29e except for the selected word line) is at approximately Vss. Since the deselected word lines are not affected by the high voltage, Vss is applied to memory array 20.

Column decoder 21b operates generally in the same manner as row decoder 21a except that column decoder 21b includes a multiple level decoding scheme. Column decode logic 25 decodes the input address and selects the appropriate column select lines 30a–30e. Each of column select lines 30a–30c, for example, is coupled to a corresponding column select line driver 23f–23h, a corresponding column select line 31a–31c and a corresponding high voltage switch 24f–24h. Furthermore, each of column select lines 31a–31c is coupled to column select logic 26 which selects the appropriate bit lines based upon the multiple level decoding scheme. Each bit line corresponds to a column of memory cells in memory array 20 such that the bit line is coupled to the drain of each memory cell.

In one embodiment of the present invention, the multiple level decoding scheme includes a first level decoder for decoding higher order column address bits, a second level decoder for decoding the next higher order column address bits, and a third level decoder for decoding the remaining column address bits. Thus, for every column select line selected by column decode logic 25, column select logic 26 may select, for example, one of one-hundred twenty-eight bit lines.

Figure 3:
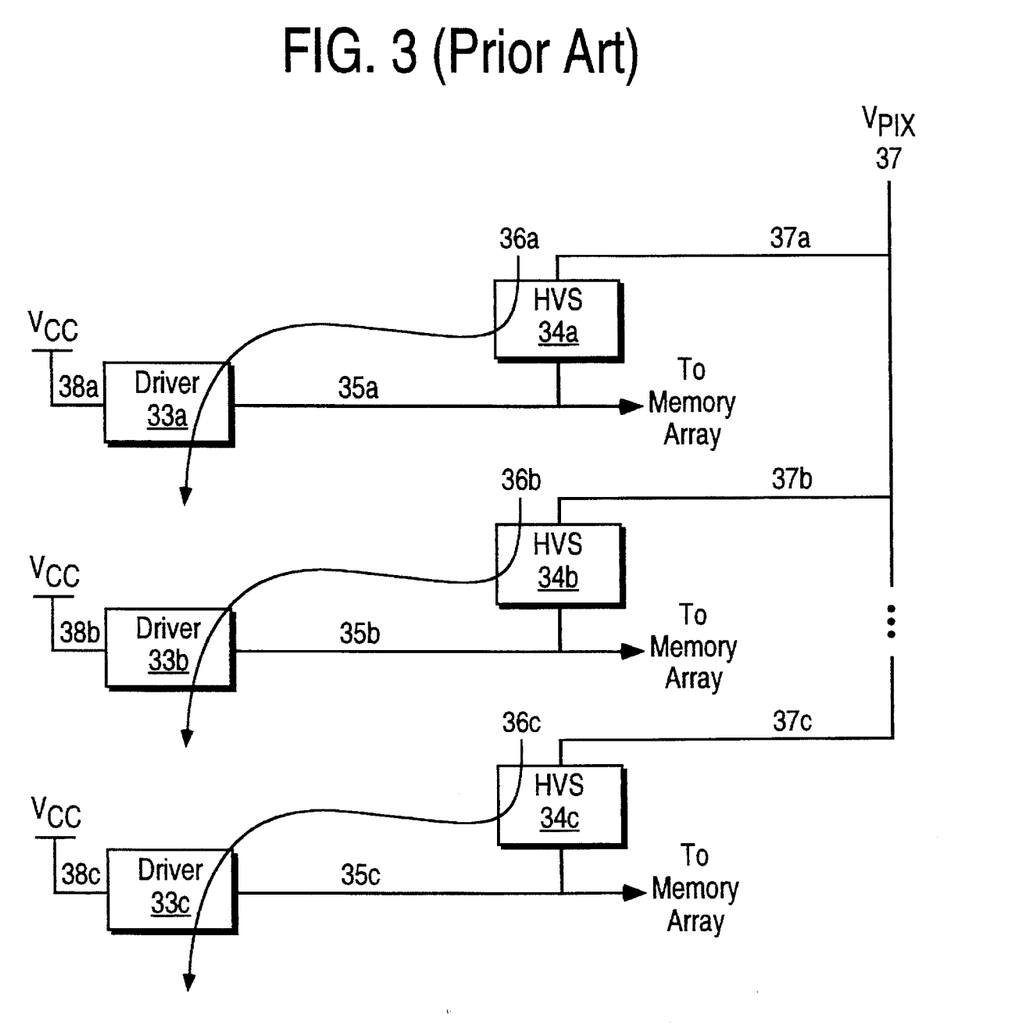
FIG. 3 illustrates a block diagram of the current leakage path of the prior art.

Compared to the prior art, the present invention reduces the DC power consumption of the programmable memory device during a reading operation. By designing an improved low power high voltage switch, the number of current leakage paths through the high voltage switches are reduced, thus lowering the overall leakage current. FIG. 3 illustrates a block diagram of the current leakage paths 36a, 36b and 36c in the prior art during a reading operation. Note that FIG. 3 may be a portion of a row decoder or a column decoder with the voltage Vpix on the high voltage line 37 at approximately Vcc–Vt. Lines 38a, 38b and 38c are deselected lines having a voltage at Vcc as explained above. The voltage on lines 35a–35c are driven low by line drivers 33a–33c to a voltage of approximately Vss. Thus, the voltage on lines 33a–33c is approximately Vss. Although the high voltage switches 34a–34c are turned "off" so as to isolate the voltage on high voltage line 37, leakage current flows from Vcc of each high voltage switch 34a–34c through the corresponding deselected line 35a–35b and out through Vss of the corresponding line driver 33a–33c.

When this prior art high voltage switch design is implemented in a typical 128K×8-bit EPROM device, 30 micro amps of leakage current flows through each path 36a–36c such that the overall leakage current of the device, which is dependent on the total number of deselected lines (about 1000), is approximately 32 milli amps of current.

Figure 4:
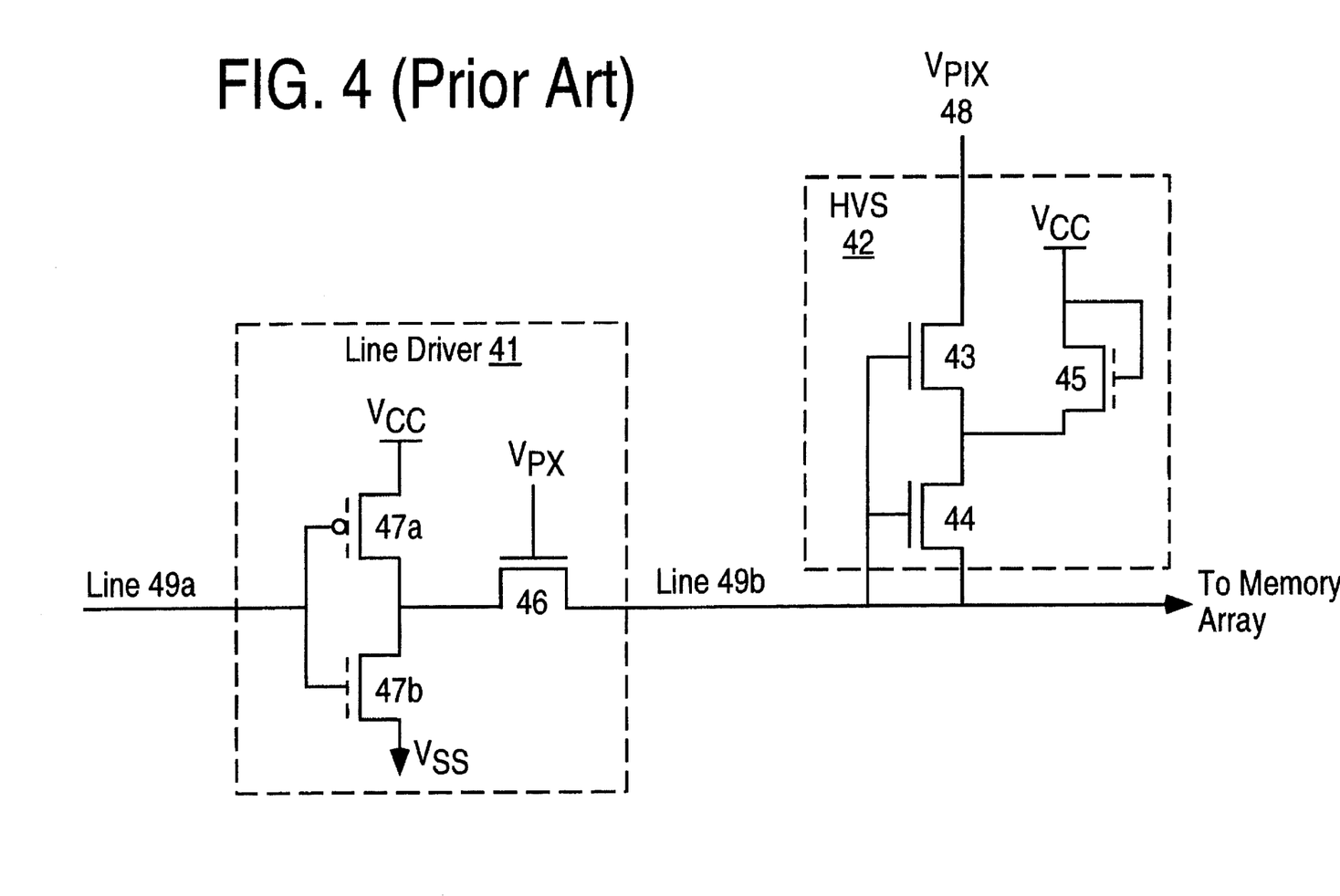
FIG. 4 illustrates a detailed drawing of the prior art circuit.

FIG. 4 illustrates the prior art in further detail. Line 49a is coupled to line driver 41 which includes a CMOS inverter coupled to a pass gate. The CMOS inverter includes an enhancement-type p-channel MOS transistor 47a coupled to an enhancement-type n-channel MOS transistor 47b and the pass gate comprises a depletion-type n-channel MOS transistor 46. The output of line driver 41 is coupled to the memory array and high voltage switch (HVS) 42 via line 49b. Line 49b is coupled to the high voltage line 48 through high voltage switch 42.

During a reading operation, Vpix is set to Vcc–Vt (Vt is the threshold voltage of an MOS transistor in the high voltage pump circuitry which provides the programming voltage) and the voltage Vpx at the gate of pass transistor 46 is set to Vcc allowing current to flow through the pass gate 46. When line 49a is deselected, it has a voltage of Vcc. The input from deselected line 49a causes line driver 41 to output on deselected line 49b approximately Vss.

High voltage switch 42 includes depletion-type n-channel MOS transistors 43 and 44 and enhancement-type n-channel MOS transistor 45. When deselected line 49a applies a voltage of Vss to the gate of transistors 43 and 44 and to the source of transistor 44, the voltage at node 42a is biased to Vcc–Vt$_{45}$ (Vt 45 is the threshold voltage of MOS transistor 45). Thus, MOS transistor 43 turns "off" preventing the voltage on high voltage line 48 from passing through high voltage switch 42 onto deselected line 49b. Although high voltage switch 42 is turned "off" by transistor 43, transistors 44 and 45 provide a conductive path allowing a leakage current to flow from the drain of transistor 45, which is tied to Vcc, through transistors 45 and 44 onto deselected line 49b through pass transistor 46 and out through the source of transistor 47b, which is tied to Vss.

When line 49a is selected (e.g. set to Vss) during a reading operation, line 49b is driven to Vcc by line driver 41, thereby raising the voltage on line 49b to Vcc. When Vcc is applied to high voltage switch 42, transistors 43 and 44 both turn "off" preventing current from flowing from Vcc of transistor 45 to Vss of transistor 47b. Thus, leakage current is not a problem when line 49a is selected.

On the other hand, when a programming operation is performed, Vpix is set to a high voltage of approximately 13 volts and Vpx at the gate of transistor 46 is set to turn off device 46 (e.g. usually Vss when device 46 is a depletion type MOSFET coupled in a pass gate manner as shown in FIG. 4). Therefore, pass gate 46 is open (i.e. not conducting) when line 49a is selected. When line 49a is selected and pass gate 46 is open, the voltage on line 49b is prevented from passing to line 49a. Because high voltage line 47 is carrying a high voltage, transistors 43 and 45 are turned "on" such that current, generated by the high voltage, flows through high voltage switch 42 to increase the voltage of line 49b to approximately 13 volts. Thus, the programming voltage on line 49b is applied to the memory array.

The present invention reduces the total power consumption of the programmable memory device by providing a low power high voltage switch. For example, the present invention may reduce the leakage current during a reading operation from approximately 32 milli amps down to about 3.25 milli amps in one embodiment and down to 1.1 milli amps in an alternative embodiment. As noted earlier, the primary power consumption of the device occurs during a reading operation; therefore, altering the current leakage path during a reading operation significantly reduces the DC power consumption.

Figure 5:
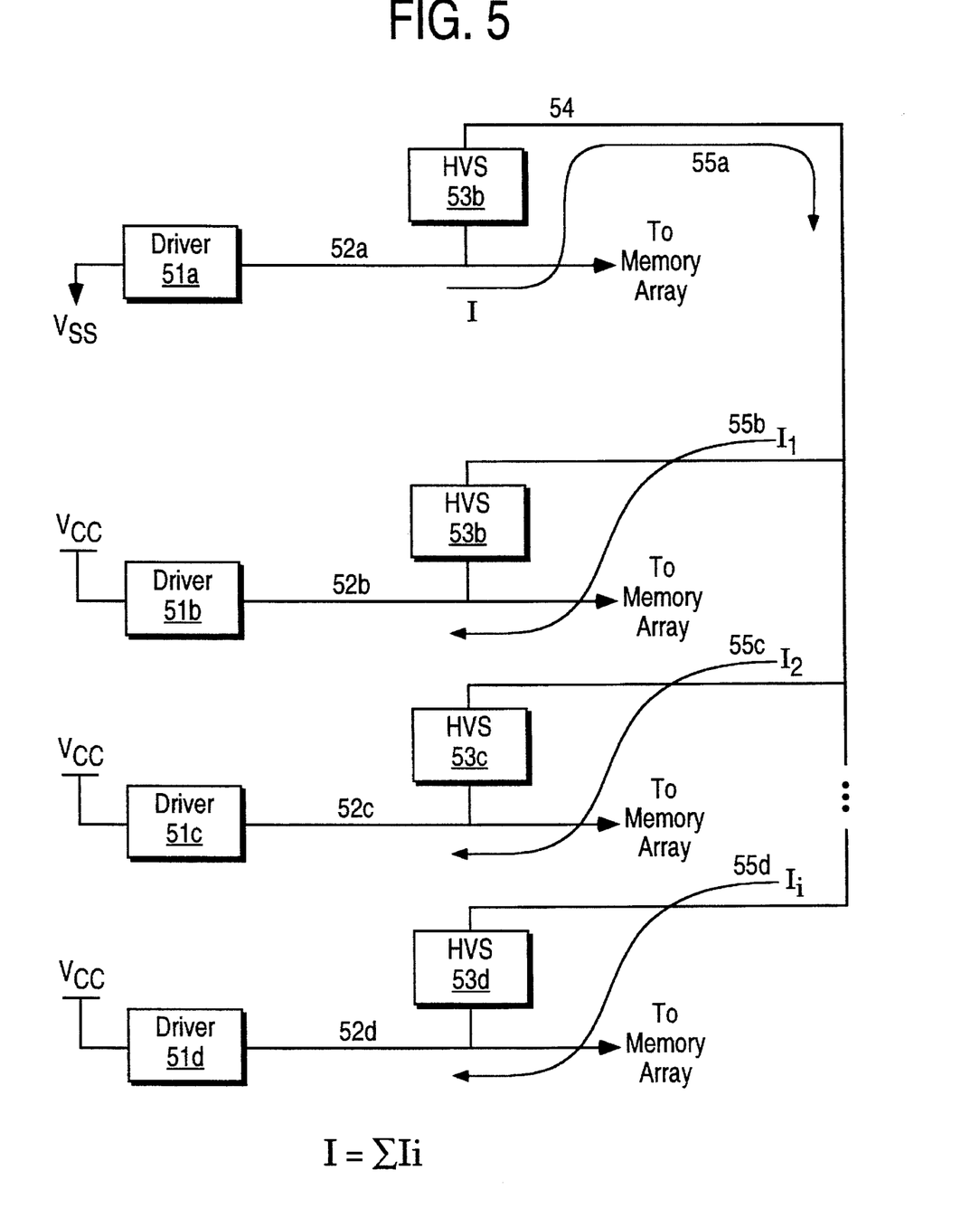
FIG. 5 illustrates a block diagram of the current leakage path of the present invention.

FIG. 5 illustrates the current leakage path during a reading operation in the present invention. During a reading operation, high voltage line 54 is set to a voltage of Vss such that leakage current flows through Driver 51a of the selected line 52a through selected high voltage switch 53a over high voltage line 54. Then, the leakage current on high voltage line 54 passes through each of deselected high voltage switches 53b–53d and over each corresponding deselected line 52b–52d and out through each corresponding deselected driver 51b–51d. Therefore, leakage current I, which flows from path 55a, is split into currents $I_1$, $I_2$ and $I_i$ as the leakage current flows out through paths 55b, 55c and 55d.

Although current flows out to Vss of each of deselected drivers (52b–52d), the number of current leakage paths is limited to the number of selected lines since the current leakage path starts from Vcc of each selected driver (51a). Typically, the number of selected lines is very few compared to the number of deselected lines and consequently the leakage current is reduced considerably. For example, in one embodiment of the present invention 2 word lines (one in each array on the IC) and 3 column selects are selected and 1030 word lines and 20 column selects are deselected. Thus, the leakage current flows from the 5 selected drivers through high voltage line 54 and out through 1050 deselected drivers.

Figure 6:
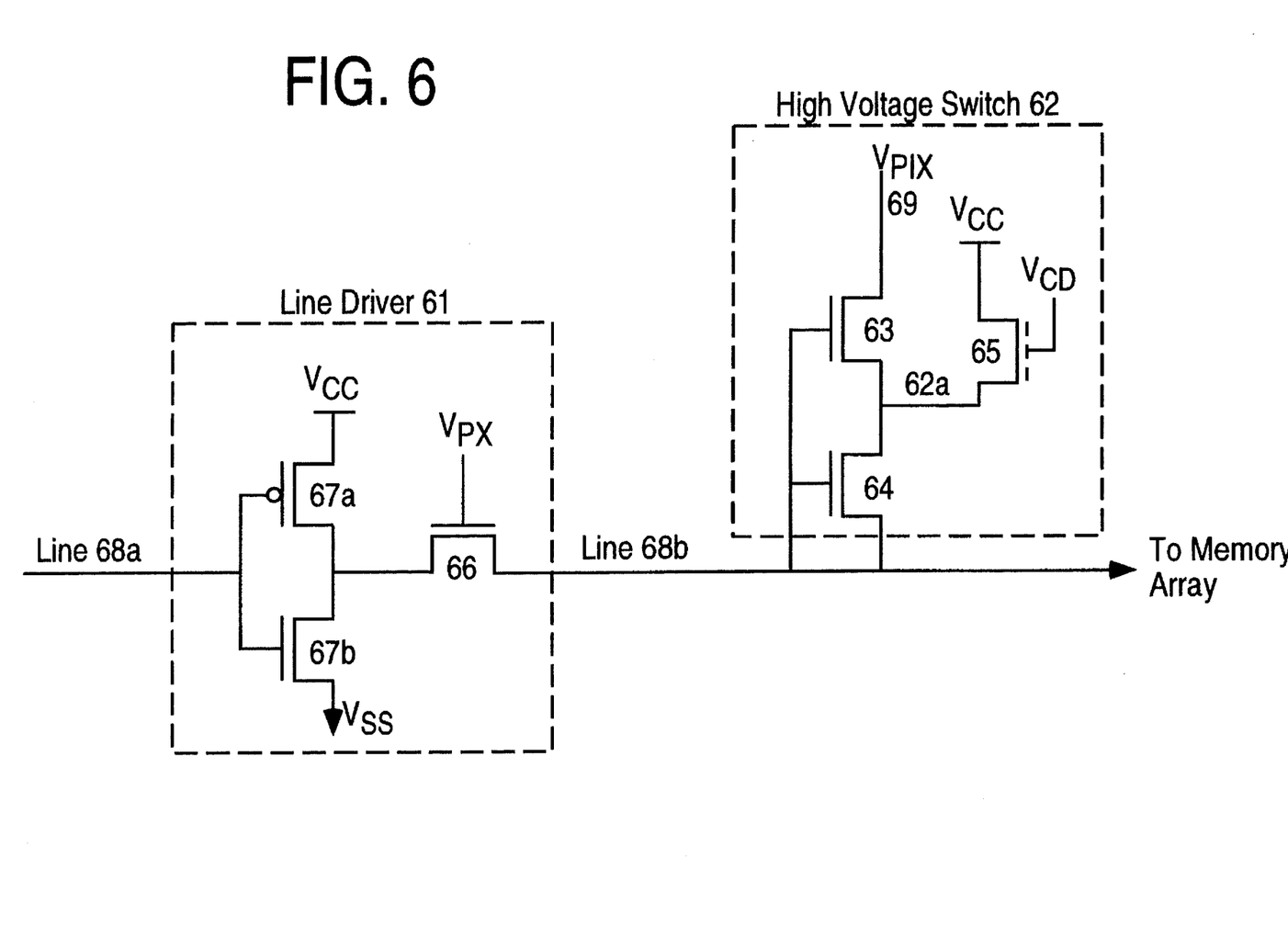
FIG. 6 illustrates a detailed drawing of the present invention.

FIG. 6 illustrates the present invention in more detail. Line driver 61 is coupled to high voltage switch 62 by line 68b (which may be either a column line or a word line). Line driver 61 includes enhancement-type p-channel MOS transistors 67a and enhancement-type n-channel MOS transistor 67b, operating as a CMOS inverter, and depletion-type n-channel MOS transistor 66, operating as a pass gate (or pass device). High voltage switch 62 includes depletion-type n-channel MOS transistors 63 and 64 and enhancement-type n-channel MOS transistor 65.

During a reading operation, $V_{PIX}$ on the high voltage line 69 is set to Vss, $V_{CD}$, which is the voltage applied to the gate of MOS transistor 65, is set to Vss, and $V_{PX}$, which is the voltage applied to the gate of MOS transistor 66, is set to turn the device 66 "on" (i.e. conducting substantially) typically by setting the gate of device 66 to Vcc.

Therefore, when line 68a is selected by one of the decoders during a reading operation, Vss is applied to line 68a. Vss, as an input to driver 61, causes driver 61 to set the voltage on line 68b to approximately Vcc. Vcc is then applied to the gates of MOS transistors 63 and 64 and to the source of MOS transistor 64. When this happens, MOS transistor 65 is turned "off" (since its gate is at Vss) and MOS transistors 63 and 64 provide a conductive path for the leakage current. Thus, MOS transistors 63 and 64 provides a pathway for leakage current to flow from Vcc at the source of MOS transistor 67a over line 68b through MOS transistors 63 and 64 onto high voltage line 69.

During a reading operation when line 68a is deselected by one of the decoders, a voltage of Vcc is applied to line 68a. After passing through line driver 61, the voltage on line 68b is decreased to approximately Vss. This voltage is then applied to the gate of MOS transistors 63 and 64 and to the source of MOS transistor 64. When this happens, transistors 63 and 64 provide a conductive path for the leakage current on high voltage line 69 (from selected rows or columns) to flow from high voltage line 69 down through MOS transistors 63, 64 and 66 and out to Vss at the source of MOS transistor 67b.

Therefore, the leakage current flows from Vcc of transistor 67a of each selected line over line 68b though high voltage switch 62 onto high voltage line 69. The total leakage current flows through high voltage line 69 where the total leakage current is divided among the deselected lines, thus dissipating through each deselected high voltage switch 62, its corresponding line 68b and out through MOS transistor 67b of the corresponding line driver 61. The current leakage path described above significantly reduces the DC power consumption of the programmable memory device during a reading operation by reducing the number of current leakage paths. Since the programmable memory device typically operates in the reading mode, reducing the DC power during a reading operation significantly reduces the overall DC power consumption of the device. For example, the present invention reduces the total leakage current in a programmable memory device having a configuration of 1 Megabits from 32 milli amps to about 3.25 milli amps.

On the other hand, when the programmable memory device is being programmed, high voltage line 69 is set to a high voltage of approximately 13 volts, $V_{CD}$ at the gate of MOS transistor 65 is set to Vcc, and the voltage $V_{PX}$ at the gate of pass transistor 66 is set to Vss. When row decoder or column decoder selects line 68a a voltage of Vss is applied to line 68a and when row decoder or column decoder deselects line 68a, a voltage of Vcc is applied to line 68a.

Therefore, during a programming operation, when line 68a is selected, the voltage on line 68a is inverted by MOS transistors 67a and 67b to Vcc. When Vcc is applied to a souce/drain input of pass device 66, pass device 66 turns "off" such that current is blocked from passing between line 68a and line 68b. (Typically, device 66 will have a gate to source threshold voltage of about −1 V.) Furthermore, MOS transistor 65 biases the voltage at node 62a at Vcc−$Vt_{65}$ (Vt is the threshold voltage of MOS transistor 65) such that MOS transistors 63 and 64 provide a conductive path allowing the current generated by the high voltage on high voltage line 69 to pass through high voltage switch 62 and to increase the voltage of line 68b to approximately 13 volts. The high voltage on line 68b is used to program the memory cells in the memory array and the high voltage is isolated from line 68a by pass device 66.

When line 68a is not selected during a programming operation, then MOS transistor 63 turns "off" preventing the high voltage on high voltage line 69 from raising the voltage on line 68b. However, MOS transistors 64 and 65 provide a conductive path such that current leaks from Vcc of MOS transistor 65, through MOS transistor 64, through pass gate 66 and out to Vss at the drain of MOS transistor 67b.

Although there is some current leakage during a programming operation, the amount of current leakage that occurs during programming does not significantly affect the overall DC power consumption of the programmable memory device since programming occurs infrequently (e.g. typically once or twice). Furthermore, programming, which is typically done in a programmer, is done at room temperature which is not the worst case scenario for power consumption.

Figure 7:
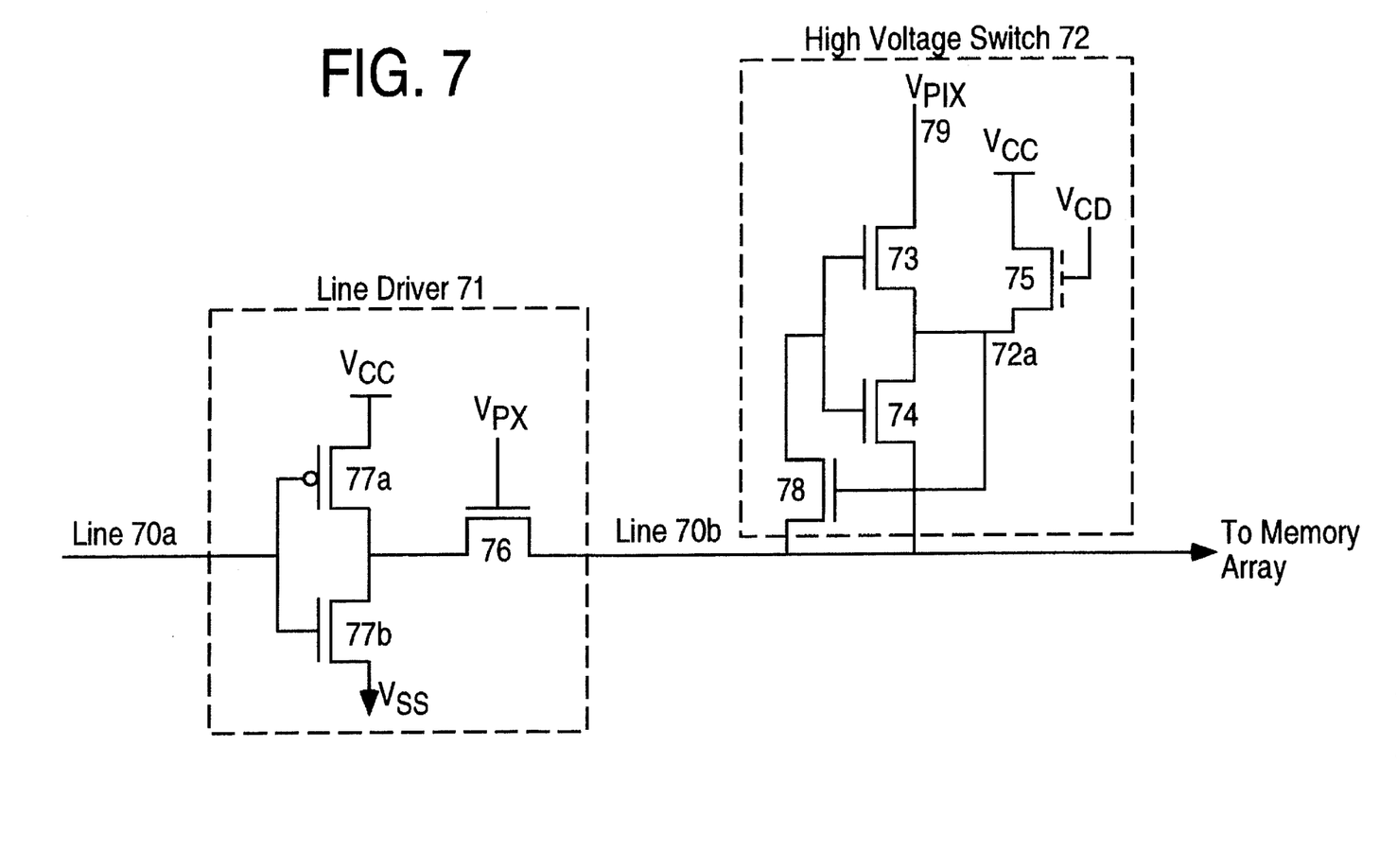
FIG. 7 illustrates an alternative embodiment of the present invention.

FIG. 7 is an alternative embodiment of the present invention that further reduces the overall DC power consumption of the programmable memory device during a reading operation. This alternative embodiment has a structure similar to the structure described in FIG. 6 except for the addition of a gate bias element. The gate bias element in FIG. 7 is the depletion-type n-channel MOS transistor 78.

Line driver 71 in the alternative embodiment includes enhancement-type p-channel MOS transistor 77a and enhancement-type n-channel MOS transistor 77b operating as a CMOS inverter to invert the voltage on Line 70a. Line driver 71 also includes depletion-type n-channel MOS transistor 76 operating as a pass gate. During a reading operation, Vpx is set to Vcc thereby allowing current to pass through transistor 76 whether or not line 70a is selected or deselected. During a programming operation, Vpx is set to Vss such that when line 70a is selected, the pass gate does not conduct substantially and when line 70a is deselected, pass gate 76 is "on" (conducts substantially).

High voltage switch 72 includes depletion-type n-channel MOS transistors 78, 73, and 74 and enhancement-type n-channel MOS transistor 75. During a reading operation, the voltage at $V_{CD}$ is set to Vss and during a programming operation, the voltage at $V_{CD}$ is set to Vcc.

MOS transistor 78 has a gate coupled to the source of MOS transistor 75 such that during a reading operation the voltage at node 72a is approximately at Vss and during a programming operation, the voltage at node 72a is Vcc−$Vt_{75}$ (Vt is the threshold voltage of transistor 75). The source of MOS transistor 78 is coupled to line 70b. When line 70a is selected during a reading operation, line 70b has a voltage at approximately Vcc and when line 70a is deselected during a reading operation, line 70b has a voltage at approximately Vss.

When Vcc is applied to the source of MOS transistor 78 and approximately 0 volt is applied to the gate of MOS transistor 78, the drain of MOS transistor 78 is at approximately 1.5 volts (which is the absolute threshold voltage of MOS transistor 78). Since the drain of MOS transistor 78 is coupled to the gate of MOS transistors 73 and 74, MOS transistor 78 controls the resistivity of MOS transistors 73 and 74. In other words, when the voltage at node 72b is reduced from approximately Vcc (in the embodiment in FIG. 6) to approximately 1.5 volts (in the embodiment in FIG. 7), then the channel resistance between the drain and source of MOS transistors 73 and 74 is increased such that the amount of current flowing through MOS transistors 73 and 74 is reduced. In other words, the resistivity of high voltage switch 72 is increased.

When Vss is applied to the source of MOS transistor 78 and approximately 0 volts is applied to the gate of MOS transistor 78, approximately 0 volts is applied to the gate of MOS transistors 73 and 74. Thus, MOS transistors 73 and 74 provide a conductive path for the leakage current on high voltage line 79 to flow through in order to be dissipated at Vss of MOS transistor 77b.

Thus, the leakage current in the alternative embodiment also follows the path described in FIG. 5. Furthermore, the leakage current in the alternative embodiment is reduced an additional 66% over the embodiment illustrated in FIG. 6. For example, if the programmable memory device consumes approximately 3.25 milli amps of current in FIG. 6, the overall leakage current is reduced to 1.1 milli amps of current in the alternative embodiment.

I claim:

1. A memory circuit having multiple low power high voltage switches, said memory circuit comprising:

a memory array that includes a plurality of memory cells and a plurality of word lines wherein each memory cell is coupled to a corresponding word line;

a high voltage line coupled to an input of said memory circuit, said high voltage line provides a conductive path for a programming input signal;

a row decoder coupled to said memory array by said plurality of word lines, said row decoder selects at least one of said plurality of word lines and deselects at least one of said plurality of word lines during a reading operation or a programming operation, each of said selected word lines has a corresponding selected word line driver and a corresponding selected high voltage switch wherein said corresponding selected word line driver is coupled to said corresponding selected high voltage switch by said corresponding selected word line, each of said deselected word lines has a corresponding deselected word line driver and a corresponding deselected high voltage switch wherein said corresponding deselected word line driver is coupled to said corresponding deselected high voltage switch by said corresponding deselected word line, each of said corresponding selected high voltage switches and each of said corresponding deselected high voltage switches is coupled to said high voltage line, each of said corresponding selected word line drivers includes a first input coupled to a first voltage conduit and each of said corresponding deselected word line drivers has a second input coupled to a second voltage conduit such that leakage current flows from said first input of said corresponding selected word line driver over said corresponding selected word line through said corresponding selected high voltage switch onto said high voltage line through said corresponding deselected high voltage switch over said corresponding deselected word line and out through said second input of said corresponding deselected word line driver during said reading operation.

2. The memory circuit of claim 1, wherein said row decoder includes row decode logic, said row decode logic decodes a plurality of input signals such that at least one of said plurality of word lines is selected and at least one of said plurality of word lines is deselected during said reading operation or said programming operation.

3. The memory circuit of claim 2, wherein each of said selected word lines has a first voltage at approximately Vss and each of said deselected word lines has a second voltage at approximately Vcc such that during said reading operation, each of said corresponding selected word line drivers raises said first voltage of each of said selected word lines from approximately Vss to approximately Vcc and each of said corresponding deselected word line drivers decreases said second voltage of each of said deselected word lines from approximately Vcc to approximately Vss.

4. The memory circuit of claim 2, wherein said word line driver comprises an inverter coupled to a pass gate.

5. The memory circuit of claim 4, wherein said inverter includes a p-channel MOS transistor and an n-channel MOS transistor, said p-channel MOS transistor having a first terminal coupled to a first terminal of said n-channel MOS transistor which is coupled to an input of said inverter, said p-channel MOS transistor further having a second terminal coupled to said first voltage conduit and a third terminal coupled to a second terminal of said n-Channel MOS transistor which is coupled to an output of said inverter, said n-channel MOS transistor further having a third terminal coupled to said second voltage conduit.

6. The memory circuit of claim 5, wherein said first voltage conduit is at Vcc and said second voltage conduit is at Vss.

7. The memory circuit of claim 4, wherein said pass gate comprises an n-channel MOS transistor, said n-channel MOS transistor having a first terminal coupled to an output of said word line driver, a second terminal coupled to an output of said inverter, and a third terminal coupled to a third voltage conduit during said reading operation and a fourth voltage conduit during said programming operation.

8. The memory circuit of claim 7, wherein said third voltage conduit is at Vcc and said fourth voltage conduit is at Vss.

9. The memory circuit of claim 1, wherein said high voltage switch comprises a first MOS transistor, a second MOS transistor, and a third MOS transistor, said first MOS transistor having a drain coupled to said high voltage line, said first MOS transistor further having a source coupled to a drain of said second MOS transistor and a source of said third MOS transistor, said first MOS transistor further having a gate coupled to a gate of said second MOS transistor and a corresponding word line, said second MOS transistor further having a source coupled to said corresponding word line, said third MOS transistor further having a drain coupled to a fifth voltage conduit, said third MOS transistor further having a gate coupled to a sixth voltage conduit during said reading operation or coupled to said fifth voltage conduit during said programming operation.

10. The memory circuit as in claim 9, wherein said fifth voltage conduit is at Vcc and said sixth voltage conduit is at Vss.

11. The memory circuit as in claim 9, wherein said programming input signal is at approximately 13 volts during said programming operation and at approximately Vss during said reading operation.

12. The memory circuit as in claim 9, wherein said first MOS transistor and said second MOS transistor are depletion-type n-channel MOS transistors, and said third MOS transistor is an enhancement-type n-channel MOS transistor.

13. The memory circuit of claim 1, wherein said high voltage switch comprises a first MOS transistor, a second MOS transistor, a third MOS transistor and a fourth MOS transistor, said first MOS transistor having a drain coupled to said high voltage line, said first MOS transistor further having a source coupled to a drain of said second MOS transistor and a source of said third MOS transistor and a gate of said fourth MOS transistor, said first MOS transistor further having a gate coupled to a gate of said second MOS transistor and a drain of said fourth MOS transistor, said second MOS transistor further having a source coupled to a corresponding word line, said fourth MOS transistor further having a source coupled to said corresponding word line, said third MOS transistor further having a drain coupled to a fifth voltage conduit, said third MOS transistor further having a gate coupled to a sixth voltage conduit during said reading operation or coupled to said fifth voltage conduit during said programming operation.

14. The memory circuit as in claim 13, wherein said first MOS transistor, said second MOS transistor and said fourth MOS transistor are depletion-type n-channel MOS transistors, and said third MOS transistor is an enhancement-type n-channel MOS transistor.

15. A memory circuit having multiple low power high voltage switches, said memory circuit comprising:

a memory array that includes a plurality of memory cells and a plurality of column groupings wherein each column grouping has a corresponding select line;

a high voltage line coupled to an input of said memory circuit, said high voltage line provides a conductive path for a programming input signal;

a column decoder coupled to said memory array by said plurality of column groupings, said column decoder selects at least one of said column groupings by selecting said corresponding select line and deselects at least one of said plurality of column groupings by deselecting said corresponding select line during a reading operation or a programming operation, each of said selected select lines has a corresponding selected line driver and a corresponding selected high voltage switch wherein said corresponding selected line driver is coupled to said corresponding selected high voltage switch by said corresponding selected select line, each of said deselected word lines has a corresponding deselected line driver and a corresponding deselected high voltage switch wherein said corresponding deselected line driver is coupled to said corresponding deselected high voltage switch by said corresponding deselected select line, each of said corresponding selected high voltage switches and each of said corresponding deselected high voltage switches is coupled to said high voltage line, each of said corresponding selected line drivers includes a first input coupled to a first voltage conduit and each of said corresponding deselected line drivers has a second input coupled to a second voltage conduit such that leakage current flows from said first input of said corresponding selected line driver over said corresponding selected select line through said corresponding selected high voltage switch onto said high voltage line through said corresponding deselected high voltage switch over said corresponding deselected select line and out through said second input of said corresponding deselected line driver during said reading operation.

16. The memory circuit of claim 15, wherein said column decoder includes column decode logic, said column decode logic decodes a plurality of input signals such that at least one of said plurality of select lines is selected and at least one of said plurality of select lines is deselected during said reading operation or said programming operation, said column decoder further includes column select logic, said column select logic selects at least one of said plurality of bit lines from each of said column groupings selected by said corresponding select line.

17. The memory circuit of claim 16, wherein each of said selected select lines has a first voltage at approximately Vss and each of said deselected select lines has a second voltage at approximately Vcc such that during said reading operation, each of said corresponding selected line drivers raises said first voltage of each of said selected select lines from approximately Vss to approximately Vcc and each of said corresponding deselected line drivers decreases said second voltage of each of said deselected select lines from approximately Vcc to approximately Vss.

18. The memory circuit of claim 16, wherein said line driver comprises an inverter coupled to a pass gate.

19. The memory circuit of claim 18, wherein said inverter includes a p-channel MOS transistor and an n-channel MOS transistor, said p-channel MOS transistor having a first terminal coupled to a first terminal of said n-channel MOS transistor which is coupled to an output of said inverter, said p-channel MOS transistor further having a second terminal coupled to said first voltage conduit and a third terminal coupled to an input of said inverter, said n-channel MOS transistor further having a second terminal coupled to said second voltage conduit and a third terminal coupled to said input of said inverter.

20. The memory circuit of claim 19, wherein said first voltage conduit is at Vcc and said second voltage conduit is at Vss.

21. The memory circuit of claim 18, wherein said pass gate comprises an n-channel MOS transistor, said n-channel MOS transistor having a first terminal coupled to an output of said inverter, a second terminal coupled to an output of said line driver, and a third terminal coupled to a third voltage conduit during said reading operation and a fourth voltage conduit during said programming operation.

22. The memory circuit of claim 21, wherein said third voltage conduit is at Vcc and said fourth voltage conduit is at Vss.

23. The memory circuit of claim 15, wherein said high voltage switch comprises a first MOS transistor, a second MOS transistor, and a third MOS transistor, said first MOS transistor having a drain coupled to said high voltage line, said first MOS transistor further having a source coupled to a drain of said second MOS transistor and a source of said third MOS transistor, said first MOS transistor further having a gate coupled to a gate of said second MOS transistor and a corresponding select line, said second MOS transistor further having a source coupled to said corresponding select line, said third MOS transistor further having a drain coupled to a fifth voltage conduit, said third MOS transistor further having a gate coupled to a sixth voltage conduit during said reading operation or coupled to said fifth voltage conduit during said programming operation.

24. The memory circuit as in claim 23, wherein said fifth voltage conduit is at Vcc and said sixth voltage conduit is at Vss.

25. The memory circuit as in claim 23, wherein said programming input signal is at approximately 13 volts during said programming operation and at approximately Vss during said reading operation.

26. The memory circuit as in claim 23, wherein said first MOS transistor and said second MOS transistor are depletion-type n-channel MOS transistors, and said third MOS transistor is an enhancement-type n-channel MOS transistor.

27. The memory circuit of claim 15, wherein said high voltage switch comprises a first MOS transistor, a second MOS transistor, a third MOS transistor and a fourth MOS transistor, said third MOS transistor further having a gate coupled to a sixth voltage conduit during said reading operation or coupled to a fifth voltage conduit during said programming operation.

28. The memory circuit as in claim 13, wherein said first MOS transistor, said second MOS transistor and said fourth MOS transistor are depletion-type n-channel MOS transistors, and said third MOS transistor is an enhancement-type n-channel MOS transistor.

29. A memory circuit having multiple low power high voltage switches, said memory circuit comprising:

a memory array that includes a plurality of memory cells, a plurality of word lines, a plurality of column groupings and a plurality of column select lines wherein each of said column groupings has a corresponding select line, each of said column groupings includes a plurality of bit lines such that each memory cell is coupled to a bit line and a word line;

a high voltage line coupled to an input of said memory circuit, said high voltage line provides a conductive path for a programming input signal;

a row decoder coupled to said memory array by said plurality of word lines, said row decoder selects at least one of said plurality of word lines and deselects at least one of said plurality of word lines during a reading operation or a programming operation, each of said selected word lines has a corresponding selected word line driver and a corresponding selected high voltage switch wherein said corresponding selected word line driver is coupled to said corresponding selected high voltage switch by a corresponding selected line, each of said deselected word lines has a corresponding deselected word line driver and a corresponding deselected high voltage switch wherein said corresponding deselected word line driver is coupled to said corresponding deselected high voltage switch by a corresponding deselected word line, each of said corresponding selected high voltage switches and each of said corresponding deselected high voltage switches is coupled to said high voltage line, each of said corresponding selected word line drivers includes a first input coupled to a first voltage conduit and each of said corresponding deselected word line drivers has a second input coupled to a second voltage conduit such that leakage current flows from said first input of said corresponding selected word line driver over said corresponding selected line through said corresponding selected high voltage switch onto said high voltage line through said corresponding deselected high voltage switch over said corresponding deselected word line and out through said second input of said corresponding deselected word line driver during said reading operation;

a column decoder coupled to said memory array by said plurality of column groupings, said column decoder selects at least one of said column groupings by selecting said corresponding select line and deselects at least one of said plurality of column groupings by deselecting said corresponding select line during a reading operation or a programming operation, each of said selected select lines has a corresponding selected line driver and a corresponding selected high voltage switch wherein said corresponding selected line driver is coupled to said corresponding selected high voltage switch by said corresponding selected select line, each of said deselected word lines has a corresponding deselected line river and a corresponding deselected high voltage switch wherein said corresponding deselected line driver is coupled to said corresponding deselected high voltage switch by said corresponding deselected select line, each of said corresponding selected high voltage switches and each of said corresponding deselected high voltage switches is coupled to said high voltage line, each of said corresponding selected line drivers includes a first input coupled to a first voltage conduit and each of said corresponding deselected line drivers has a second input coupled to a second voltage conduit such that leakage current flows from said first input of said corresponding selected line driver over said corresponding selected select line through said corresponding selected high voltage switch onto said high voltage line through said corresponding deselected high voltage switch over said corresponding deselected select line and out through said second input of said corresponding deselected line driver during said reading operation.

30. A programmable memory circuit operating at low power during a reading operation, said programmable memory circuit comprising:

a memory array;

a plurality of conductive lines;

decoding logic coupled to said memory array by said plurality of conductive lines, said decoding logic selects at least two of said plurality of conductive lines;

a plurality of line drivers, each of said plurality of line drivers is coupled to said memory array by a corresponding conductive line;

a plurality of high voltage switches, each of said plurality of high voltage switches is coupled to said memory array and a corresponding line driver by a corresponding conductive line;

a high voltage line coupled to each of said high voltage switches, said high voltage line provides a conductive path for an input voltage signal;

during a reading operation, each conductive line selected has a corresponding selected line driver and a corresponding selected high voltage switch and each conductive line not selected has a corresponding deselected line driver and a corresponding deselected high voltage switch such that leakage current flows from each of said corresponding selected line drivers over each of said corresponding lines selected through each of said corresponding high voltage switches onto said high voltage line where said current dissipates through each of said corresponding deselected high voltage switches over each of said corresponding lines not selected and out through each of said corresponding deselected line drivers.

31. A method of operating a programmable memory circuit at low power during a reading operation, said method comprising:

selecting a selected line driver and a corresponding selected switch;

deselecting a plurality of deselected line drivers and a plurality of corresponding deselected switches;

routing a leakage current through a path, said path having a first end and a plurality of second ends, said first end being coupled to said selected line driver, and said plurality of second ends being coupled to said plurality of deselected line drivers, such that said leakage current is limited by the number of selected line drivers.

* * * * *